(12) United States Patent
Privitera

(10) Patent No.: US 8,319,597 B2
(45) Date of Patent: Nov. 27, 2012

(54) RESISTOR STRUCTURE OF PHASE CHANGE MATERIAL AND TRIMMING METHOD THEREOF

(75) Inventor: Stefania Maria Serena Privitera, Catania (IT)

(73) Assignee: STMicroelectronics S.r.l., Agrate Brianza (IT)

(*) Notice: Subject to any disclaimer, the term of this patent is extended or adjusted under 35 U.S.C. 154(b) by 328 days.

(21) Appl. No.: 12/638,922

(22) Filed: Dec. 15, 2009

(65) Prior Publication Data
US 2010/0156588 A1 Jun. 24, 2010

(30) Foreign Application Priority Data
Dec. 18, 2008 (IT) .............................. TO2008A0951

(51) Int. Cl.
*H01C 7/06* (2006.01)
(52) U.S. Cl. ............................... 338/7; 338/22 R; 338/9
(58) Field of Classification Search ................ 338/22 R, 338/7, 8, 9
See application file for complete search history.

(56) References Cited

U.S. PATENT DOCUMENTS

| | | | |
|---|---|---|---|
| 4,703,557 A | 11/1987 | Nespor et al. | |
| 4,907,341 A | 3/1990 | Chapel, Jr. et al. | |
| 5,166,758 A | 11/1992 | Ovshinsky et al. | |
| 5,233,327 A | 8/1993 | Bartush et al. | |
| 5,296,716 A | 3/1994 | Ovshinsky et al. | |
| 5,534,711 A | 7/1996 | Ovshinsky et al. | |
| 5,536,947 A | 7/1996 | Klersy et al. | |
| 5,596,522 A | 1/1997 | Ovshinsky et al. | |
| 5,687,112 A | 11/1997 | Ovshinsky | |
| 6,097,276 A * | 8/2000 | Van Den Broek et al. | 338/9 |
| 6,211,769 B1 * | 4/2001 | Baldwin et al. | 338/7 |
| 6,326,256 B1 | 12/2001 | Bailey et al. | |
| 6,497,824 B1 | 12/2002 | Chen et al. | |
| 6,621,404 B1 | 9/2003 | Banerjee | |
| 6,646,539 B2 * | 11/2003 | Bloch | 338/9 |
| 6,647,614 B1 | 11/2003 | Ballantine et al. | |
| 7,217,981 B2 | 5/2007 | Coolbaugh et al. | |
| 2004/0241951 A1 | 12/2004 | Amadon et al. | |
| 2006/0145296 A1 | 7/2006 | Coolbaugh et al. | |
| 2006/0164202 A1 | 7/2006 | Lee | |

FOREIGN PATENT DOCUMENTS

| | | |
|---|---|---|
| EP | 0 245 900 | 11/1987 |
| EP | 2200049 A1 | 6/2010 |

OTHER PUBLICATIONS

European Search Report and Opinion Dated Apr. 13, 2010, for European Patent Application No. 09179740 Filed Dec. 17, 2009, 7 Pages.
"A Review of Thirty-Five Years of Laser Trimming With a Look to the Future", Phil Deluca, Proceedings of the IEEE, vol. 90, No. 10, Oct. 2002.

(Continued)

Primary Examiner — Kyung Lee
(74) Attorney, Agent, or Firm — Graybeal Jackson LLP

(57) ABSTRACT

An embodiment of a resistor formed by at least one first portion and one second portion, electrically connected to one another and with different crystalline phases. The first portion has a positive temperature coefficient, and the second portion has a negative temperature coefficient. The first portion has a first resistivity, and the second portion has a second resistivity, and the portions are connected so that the resistor has an overall temperature coefficient that is approximately zero.

39 Claims, 9 Drawing Sheets

OTHER PUBLICATIONS

"Low-Cost and Nanoscale Non-Volatile Memory Concept for Future Silicon Chips", Martijn H.R. Lankhorst et al., Natural Materials, vol. 4, Apr. 2005.

"Chalcogenide Thin Films for Direct Resistors Fabrication and Trimming", G. Lullo et al., Materials Science in Semiconductor Processing, Published by Elsevier Ltd. 2004.

"Lightly Trimming the Hybrids", A. Elshabini-Riad et al., IEEE, 1993.

"Ultra-Thin Phase-Change Bridge Memory Device Using GeSb", Y.C. Chen et al., IEDM 2006.

"OUM—A 180 nm Nonvolatile Memory Cell Element Technology for Stand Alone and Embedded Applications", S. Lai et al., Session 36.5, IEDM Technical Digest, 2001.

"Laser Interaction with SiCr Thin Film Resistors The Bubble Theory", Edward Coyne, 41st Annual International Reliability Physics Symposium, Dallas Texas, 2003.

Search Report for IT TO2008A000951.

* cited by examiner

RESISTOR STRUCTURE OF PHASE CHANGE MATERIAL AND TRIMMING METHOD THEREOF

PRIORITY CLAIM

The present application claims priority to Italian Patent Application No. TO2008A000951, filed Dec. 18, 2008, which application is incorporated herein by reference in its entirety.

TECHNICAL FIELD

An embodiment of the present relates to a resistor structure of phase change material with trimmable resistance and trimmable temperature coefficient of resistance and to a trimming method thereof.

BACKGROUND

As is known, many integrated circuits employ thin-film resistors usually for controlling the current or the voltage of other components of the integrated circuit. Thin-film resistors are typically deposited by vacuum evaporation or sputtering and are made of different materials, such as CrSi, TaN, and NiCr.

Even using highly controlled processes, the initial resistance of these components may have a tolerance of 3-15%, according to the desired value of resistance. More accurate values may be obtained by physically removing portions of the resistor in a subsequent trimming operation, carried out via laser while verifying the electrical characteristics of components at wafer level, i.e., during electrical wafer sorting (EWS). To this end, laser-beam trimming systems have been developed, which have various advantages, such as speed, accuracy, and cleanliness. These systems may be controlled via computer to modify and adjust the electrical parameters of the components while their values are being measured.

However, resistors are frequently sensitive to temperature. For example, current-reference circuits use load resistors for controlling the current level. As the operating temperature of the circuit changes, the current also changes. Often in devices and circuits where resistor precision is required, large resistance values may also be required because the resistor area may be a controlling factor in determining the device density. Even though, for manufacturing good resistors, materials with high resistivity may be used, they typically have a high temperature coefficient of resistivity (TCR), in the order of about 100 ppm/° C. The TCR is defined as the normalized first derivative of resistance versus temperature and provides an adequate way for measuring the performance of a resistor.

In order to obtain resistors with almost zero TCR, various solutions have been proposed, such as series- or parallel-connected resistors, of different materials having different TCRs, and, more precisely, positive TCRs and negative TCRs matched together so that the effective temperature coefficient is almost zero (see, by way of example, U.S. Pat. No. 7,217,981, which is incorporated by reference).

However, trimming of the TCR may require manufacturing and connecting at least two or more resistors having different TCRs. Consequently, the known solutions are rather complex and require many masks, various materials, and/or various levels of interconnection, and the finished devices that include these resistors are costly.

SUMMARY

An embodiment of the present disclosure is a resistor structure that overcomes at least some of the drawbacks of the prior art.

BRIEF DESCRIPTION OF THE DRAWINGS

For a better understanding of the present disclosure, one or more embodiments thereof are now described, purely by way of non-limiting example, with reference to the attached drawings, wherein.

DETAILED DESCRIPTION

Figure 1:
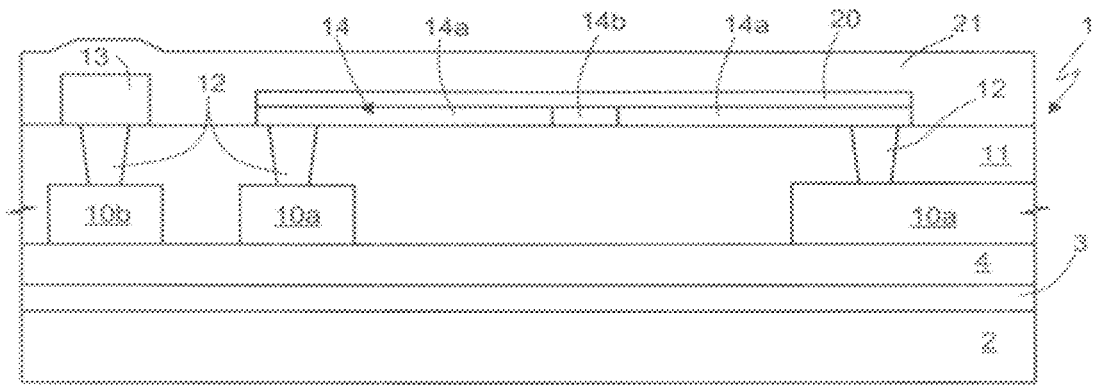
FIG. 1 is a view in cross-section of an embodiment of a phase change resistor.

FIG. 1 shows a resistor 1 of phase change material (identified hereinafter as a PC resistor) formed on a substrate 2. The substrate 2 may be of a semiconductor material, or may be a silicon-on-insulator (SOI) substrate, or a flexible substrate with transistors and other electronic components integrated inside it or on top of it. In an embodiment, a phase change material may be characterized by a strong variation of the electrical resistivity and by a change of the polarity of the temperature coefficient of resistance as a result of a phase transition being obtainable by heating, annealing, and melting the material using a thermal process, or electric or laser pulses.

In the example shown, the substrate 2 comprises an insulating structure 3. The insulating structure 3 may be formed, for example, by a silicon-oxide field-insulation region, or by a trench insulation region of a shallow trench or deep trench type, which extends inside the substrate 2. A first dielectric layer 4, for example of oxide, extends on the insulating structure 3.

Bottom metal regions 10a, 10b are formed on the first dielectric layer 4 and may be part of the first metal level or of any metal level. The bottom metal regions 10a, 10b are, for example, of aluminium or copper-aluminium, with suitable barrier layers, but other metals may be used. An intermediate dielectric layer 11 extends on the first dielectric layer 4 and on the bottom metal regions 10a, 10b. The intermediate dielectric layer 11 may be a single layer or a multilayer of tetraorthosilicate (TEOS), a spin-on glass, a fluorinated-silicon glass (FSP), phosphorous-boron-silicon glass (PBSG) or other dielectric, in a per se known manner.

Vias 12 extend through the intermediate dielectric layer 11 and connect the bottom metal regions 10a, 10b with top metal regions 13 or with a resistive region 14 of phase change material. The vias 12 may be formed by a suitably designed barrier layer (for example, of Ti or TiN), and are filled, for example, with tungsten. Alternatively, the vias 12 may be filled directly by the metal of the top metal layer (forming the top metal regions 13).

Figure 2:
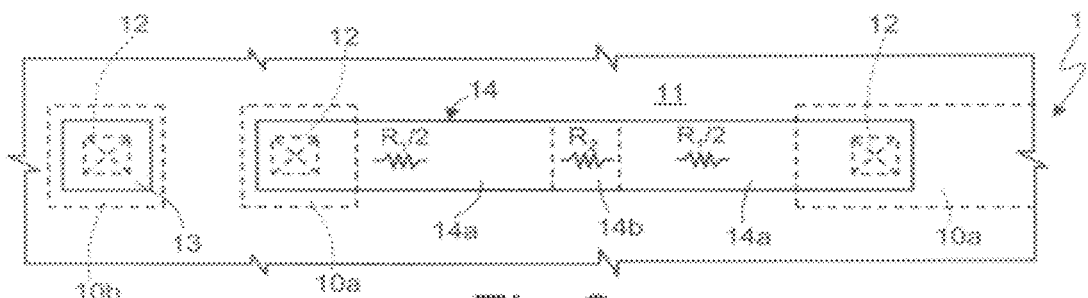
FIG. 2 is a top plan view of an embodiment of the phase change resistor of FIG. 1.

In FIG. 2, where the top layers have been removed, the resistive region 14 is formed by a single strip of phase change material, provided with two ends extending on top of, and in direct electrical contact with, respective vias 12.

The phase change material of the resistive region 14 may include at least one chalcogen element. Generally the phase change material according to an embodiment of the present disclosure is formed from a plurality of atomic elements, for example, including one or more elements from the group consisting of Te, Se, S, Ge, Sb, Bi, Si, O, N, and mixtures or alloys thereof. For example, the chalcogen element is Te, and the phase change material is an alloy of Te and Ge or Te and Sb. In another example, the chalcogenide alloy may be an alloy comprising Ge, Sb and Te, with composition along the pseudobinary line GeTe—$Sb_2Te_3$, such as, for example, $Ge_2Sb_2Te_5$. Other suitable phase change materials are described in the following documents, which are incorporated by reference: U.S. Pat. No. 5,166,758; U.S. Pat. No. 5,296,716; U.S. Pat. No. 5,534,711; U.S. Pat. No. 5,536,947; U.S. Pat. No. 5,596,522; and U.S. Pat. No. 5,687,112.

The resistive region 14 may have a uniform width (in the direction perpendicular to the drawing plane of FIG. 1). The thickness of the resistive region 14 may be constant and may range approximately between 10 and 200 nm, according to the resistance desired.

A protective layer 20 and a passivation layer 21 extend on the resistive region 14. The top metal regions 13 may extend on the intermediate dielectric layer 11, in contact with respective vias 12. The protective layer 20 may be of silicon oxide, silicon nitride, or other dielectric material, the top metal regions 22 may be of the same material as the bottom metal regions 10, and the passivation layer 21 may be of silicon oxide, silicon nitride, or a combination thereof.

The resistive region 14 comprises at least two areas having different crystalline phases, and precisely such as to have opposite behaviors versus temperature, i.e., resistive temperature coefficients of different polarities.

In the embodiment of FIGS. 1 and 2, as represented schematically by the dashed boundary lines, the crystalline region 14 comprises two first areas 14a, in the metallic phase, and a second area 14b, here in an intermediate position and in the semiconductive phase, as discussed in detail hereinafter.

As is known, phase change materials are characterized by marked variations of the electrical and optical characteristics following upon phase transitions. Reversible phase transitions may be obtained by heating and melting, for example, using thermal annealing, laser annealing or electrical pulses.

Figure 3:
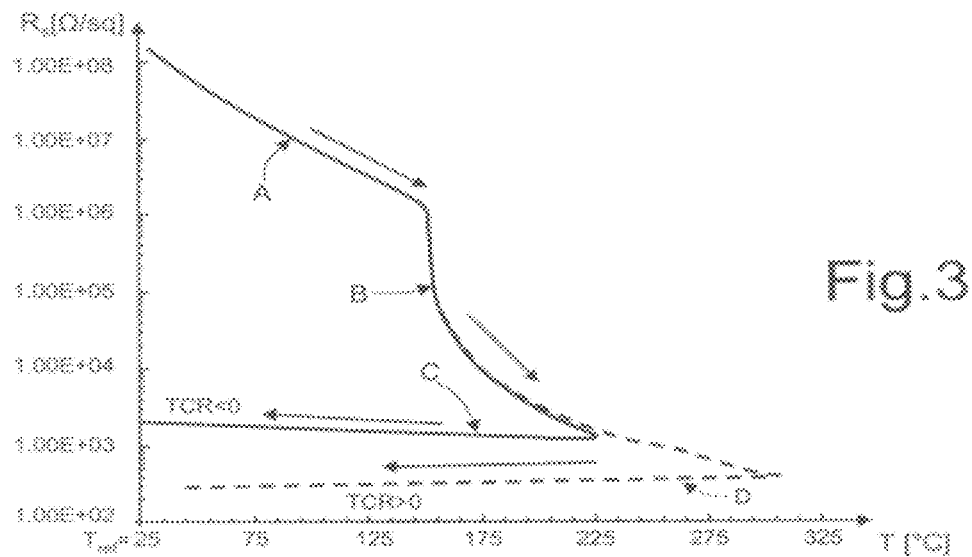
FIG. 3 shows the sheet resistance versus temperature for an embodiment of a phase change material.

In particular, phase change materials have stable phases that are variable between a completely amorphous phase and a completely crystalline phase, including the intermediate phases. FIG. 3 shows the sheet resistance $R_s$ of a phase change layer of $Ge_2Sb_2Te_5$, which, starting from the amorphous phase, is heated at a rate of 15° C./min and then cooled. The solid line shows the sheet resistance for a heating up to 225° C. at the rate indicated above, and subsequent cooling; the dotted line shows the evolution for a heating up to 325° C. at the same rate, and subsequent cooling.

In either case, the dependence of the resistance upon temperature during cooling differs markedly from its initial behavior. In particular, the rapid reduction in resistance corresponds to a phase transition. A first phase transition, at approximately 155° C. (knee between stretch A and stretch B) corresponds to a transition from the amorphous to the polycrystalline phase. As may be noted, in stretch B, during transition there is a sharp reduction in the resistance. A second phase transition occurs in the case represented with a dotted line (turning point between stretch B and stretch D) and corresponds to the passage from one polycrystalline phase to a different polycrystalline phase, characterized by a lower resistance and by a positive temperature coefficient (TCR>0), typical of metal materials. The polycrystalline phase described by the stretch of curve D is thus identified as "metallic phase". In the case represented by the solid line, the second phase transition does not occur so that the stretch of curve C, with negative temperature coefficient, describes the behavior of regions of phase change material identified hereinafter as being in the "semiconductive phase".

In case of phase change materials of alloys of GeSbTe with compositions along the pseudobinary line GeTe—$Sb_2Te_3$, the phase formed at a lower temperature typically has a face-centred cubic structure (fcc) and is characterized by a resistivity that may range between approximately $10^{-3}$ and $10^{-2}$ $\Omega\cdot cm$, depending on the composition. The phase formed at higher temperature has a hexagonal structure and a resistivity that ranges between $10^{-4}$ and $10^{-3}$ $\Omega\cdot cm$.

Figure 4:
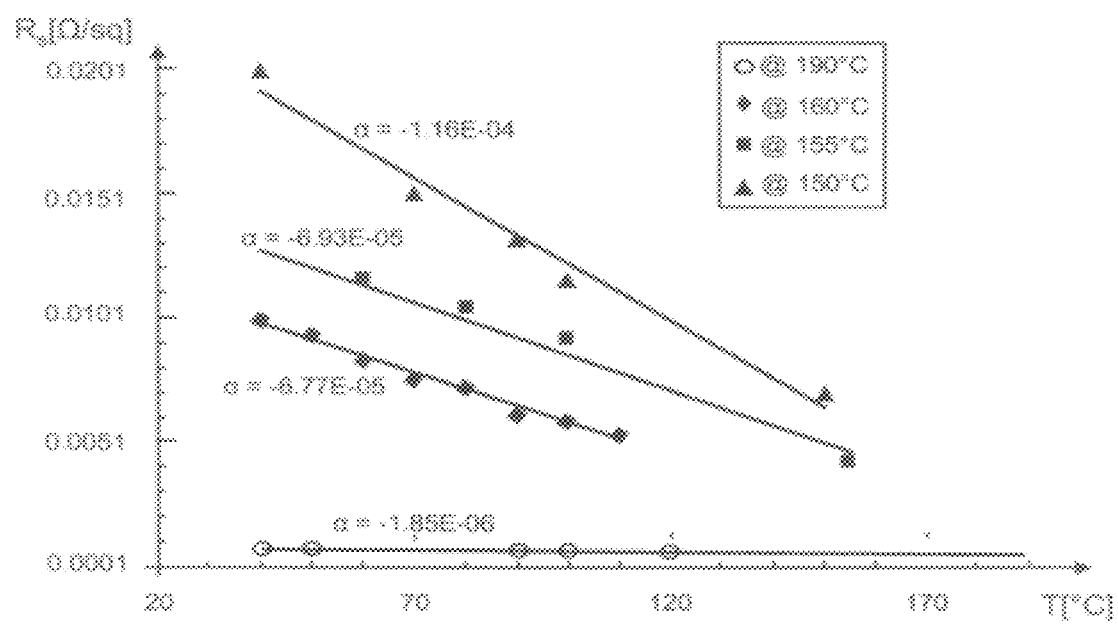
FIG. 4 shows the resistivity versus temperature for an embodiment of phase change resistors manufactured at different temperatures.

Different formation temperatures of phase change material layers give rise to different resistivities and different temperature coefficients. For example, FIG. 4 shows the sheet resistivity $R_s$ versus temperature for a layer of $Ge_2Sb_2Te_5$ crystallized in the semiconductive phase, at different temperatures. FIG. 4 clearly shows that the resistivity and its temperature dependence depend upon the temperature to which the layer has been heated. This property is here exploited for fine trimming of the resistivity and of the temperature coefficient of resistance of an embodiment of the present PC resistor.

To return to FIGS. 1 and 2, the resistor 1 is equivalent to the series-connection of two resistors having, respectively, a first resistance $R_1$ (for example, formed by the sum of the two first areas 14a, each having resistance $R_1/2$) and a second resistance $R_2$ (for example, formed by the second area 14b). The two resistances $R_1$, $R_2$ are characterized, respectively, by a first resistivity $\rho_1$ and a second resistivity $\rho_2$, which correspond, respectively, to the metallic phase and to the semiconductive phase (i.e., they have the behavior described by the stretch of curve D and by the stretch of curve C, respectively, in FIG. 3).

The total series resistance of the resistor 1 is given by $$R = R_1 + R_2 = \rho_1 N_1 + \rho_2 N_2 \quad (1)$$

where $N_1$ and $N_2$ are geometrical factors, defined as L/S, where L is the length of the respective area 14a, 14b of the resistive region 14 (where the sum of the two areas 14a is considered), and S is the section of the resistive region 14 (which is the same for both of the areas).

As is known, the resistivity of each portion varies with the temperature according to the relation $$\rho = \rho_0 + \alpha(T - T_{ref}) \quad (2)$$

where $\rho_0$ is the resistivity at the reference temperature $T_{ref}$ and $\alpha$ is the non-normalized temperature coefficient (normalized TCR=$\alpha/\rho_0$).

If the total resistance R is intended to be stable with temperature, the resistive region 14 should have an approximately zero temperature coefficient (TCR=0), i.e., the first derivative of the total resistance R is approximately equal to zero. This means that the temperature coefficients $\alpha_1$ and $\alpha_2$ of the first resistance $R_1$ and of the second resistance $R_2$ satisfy the following relation:

$$\alpha_1 N_1 + \alpha_2 N_2 \approx 0 \quad (3)$$

In order for the resistor 1 to have a given total resistance R and approximately zero TCR, the system of equations given by the relations (1) and (3) is to be solved.

This system has a unique solution if the coefficient matrix is non-singular, i.e., if the determinant of the coefficient matrix ($\rho_1\alpha_2-\rho_2\alpha_1$) is other than zero. Since the resistor 1 has two phases, one (the semiconductive phase) with $\alpha_2<0$ and the other (the metallic phase) with $\alpha_1>0$, the determinant of the coefficient matrix is always other than zero, and a unique solution exists. On the basis of Cramer rule, the solution is given by:

$$N_2 = R\alpha_1/(\rho_2\alpha_1-\rho_1\alpha_2)$$

$$N_1 = -R\alpha_2/(\rho_2\alpha_1-\rho_1\alpha_2)$$

Consequently, the geometrical factors $N_1$ and $N_2$ satisfy the relation $$N_2/N_1 = -\alpha_1/\alpha_2 \quad (4)$$

In the present context, the expression "approximately zero temperature coefficient", used herein, takes into account the manufacture tolerances and/or the measurement errors and/or the thermal drift, so that, for example, resistors having a temperature coefficient TCR within a range of approximately ±50 ppm/K are considered to be within an embodiment of this disclosure.

Figure 5:
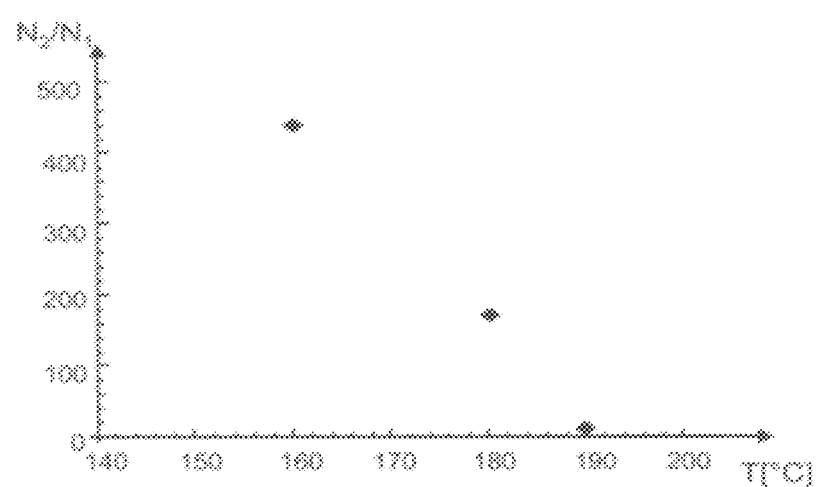
FIG. 5 shows the ratio between the number of squares in metallic phase and the number of squares in semiconductive phase with a zero overall temperature coefficient, versus the trimming temperature, of an embodiment of a phase change resistor.

According to one embodiment, it is possible to deposit the resistive region 14 at a first temperature, and modify the resistivity of resistor 14 via thermal annealing so as to satisfy Eq. (4). In particular, it is possible to obtain various pairs of solutions ($N_1$, $N_2$), according to the temperature at which the resistive region 14 is deposited and the temperature at which the resistive region 14 is annealed. By way of example, FIG. 5 shows the ratio $N_1/N_2$ obtained considering various annealing temperatures for a layer of $Ge_2Sb_2Te_5$ formed as described. As may be noted, for the stoichiometry of $Ge_2Sb_2Te_5$, the ratio $N_1/N_2$ may be between approximately 10 and 500 and beyond, according to the annealing temperature of the resistive region 14.

According to an embodiment, it is possible to deposit the resistive region 14 at a first temperature, so that it is initially in the metallic phase, and to modify the resistivity of the portion that is to form the second area 14b, so as to bring it into the semiconductive phase, by melting it and then cooling it down to a second temperature lower than the deposition temperature.

As an example, for a phase change resistor formed from $Ge_2Sb_2Te_5$ to have a TCR approximately equal to zero, the larger area of the resistive region 14 is in the metallic phase (first areas 14a), at a low resistance and with $\alpha>0$. This is the phase typically obtained after the manufacturing of silicon integrated circuits, wherein temperatures of up to 400° C. are employed. To obtain the resistance required and TCR≈0, only a small portion (1/10 or less) of the resistive region 14 (for example, in FIG. 5, the second area 14b) is converted into the semiconductive phase (with higher resistance and $\alpha<0$).

On the basis of the above, the resistor 1 may be manufactured as described hereinafter. The dielectric layer 4 is formed on the substrate 2, possibly on the insulating structure 3, the bottom metal regions 10 and the interlevel dielectric layer 11 are formed, the vias 12 are opened and then filled with metal material, and then the resistive region 14 is formed, by depositing a phase change material, for example, the above alloy of GeSbTe, and subsequently defined. In particular, the resistive region 14 is deposited at a temperature such as to obtain, once cooled, the resistivity $\rho_1$. Then, the protective layer 20 is formed and defined together with the resistor, and then the top metal regions 13 and the passivation layer 21 are formed.

Figure 6:
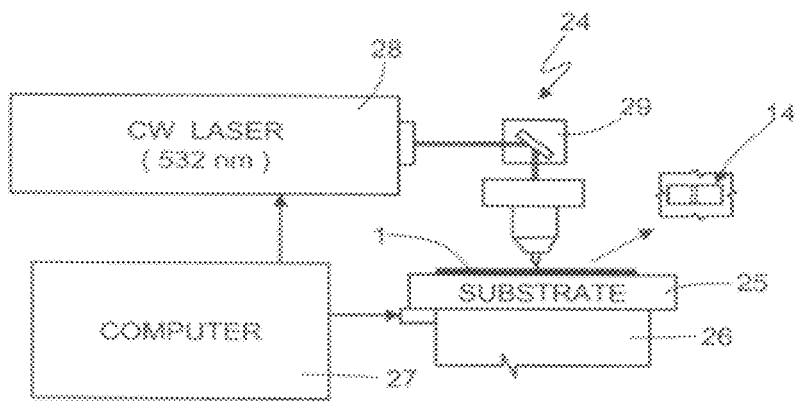
FIG. 6 shows an apparatus for trimming an embodiment of phase change resistors.

In the final verification step (during electrical wafer sorting—EWS), the second area 14b of the resistive region 14 is subject to laser annealing, as represented in FIG. 6, which shows schematically a laser apparatus 24 used for selectively irradiating a wafer 25 of semiconductor material, which integrates a plurality of resistive regions 14. In a per se known manner, the wafer 25 is carried by a holder 26, which is controlled via a computer 27 and in turn controls a laser generator 28, which, through appropriate optics 29, causes heating of the second areas 14b to be treated.

For example, it is possible to use a frequency-doubled diode-pumped CW Nd:YAG laser at 532 nm, using laser pulses having a power of 10-15 mW and duration of 100-400 ns. Melting and subsequent recrystallization thus cause transition of the second areas 14b into the desired semiconductive phase. In addition, since the phase transition is completely reversible, the resistive regions 14 may be treated again so as to obtain more precise desired values of TCR.

Therefore, at the end of the fabrication steps, the resistor 1 is trimmed so as to have the desired value of resistance R and an approximately zero TCR.

When the resistor 1 also requires an adjustment of the resistance value, it is possible to perform a trimming thereof, in addition to a trimming of the temperature coefficient TCR, by laser cutting. Laser cutting may be performed in a known way so as to remove material, as shown, for example, in FIG. 7. In particular, using the same laser apparatus 24, but different power levels and pulse durations, in a per se known manner, the resistive region 14 is subject to one or more cutting operations (as regards the technique of trimming of resistance via laser cutting, see, for example, "A Review of Thirty-Five years of Laser Trimming With a Look to the Future" Phil Deluca, Proceedings of the IEEE, vol. 90, No. 10, October 2002, which is incorporated by reference).

Figure 7:
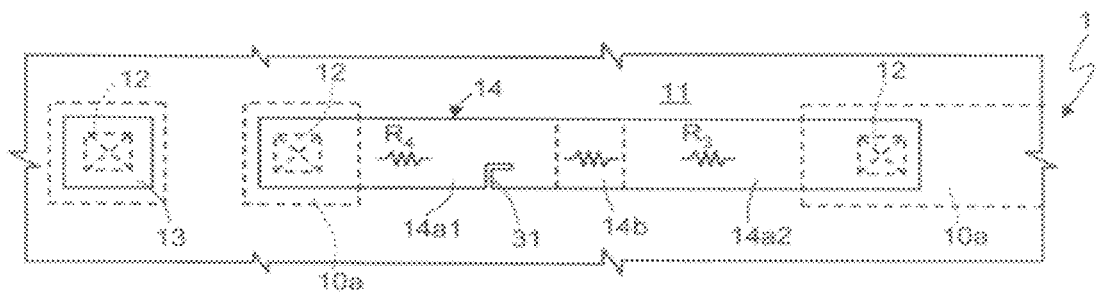
FIGS. 7-9 are top plan views of other embodiments of phase change resistors.

FIG. 7 shows a resistive region 14, a first area 14a1 of which has a cut 31, shaped like an L turned upside down, such as to modify the value of resistance of this area. Alternatively, the cut 31 may comprise a single rectilinear portion, or other forms deemed appropriate for achieving the desired precision, in a per se known manner.

In this case, the first areas in the metallic phase, here designated 14a1 and 14a2, may have different resistances $R_3$ and $R_4$. Also in this case, the resistivity values of the different areas are such that the first derivative of the resistance is equal to approximately zero and total resistance equal to R.

Figure 8:
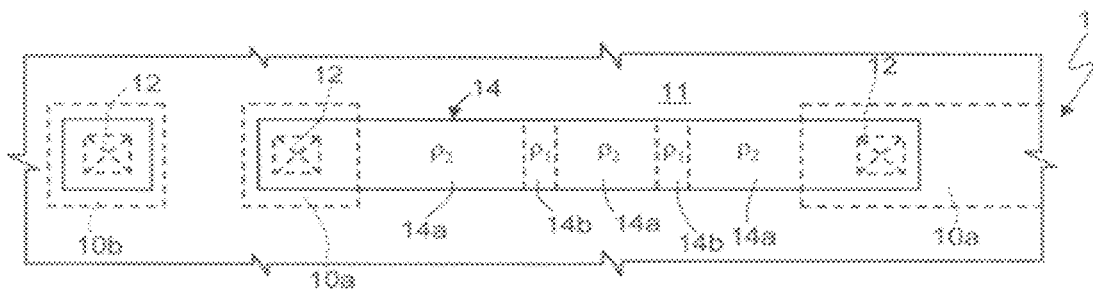

In another embodiment, the resistive region 14 has different regions in the two, semiconductive and metallic, phases, as shown, for example, in FIG. 8. In an embodiment, there are provided two second areas 14b, in the semiconductive phase, and three first areas 14a, in the metallic phase. Other configurations are, however, possible, starting from the presence of a single first area 14a and a single second area 14b, up to solutions including a plurality of first areas 14a and/or second areas 14b, with various degrees of resistivity, provided that the derivative of the total resistance is approximately zero and the total resistance is R.

Figure 9:
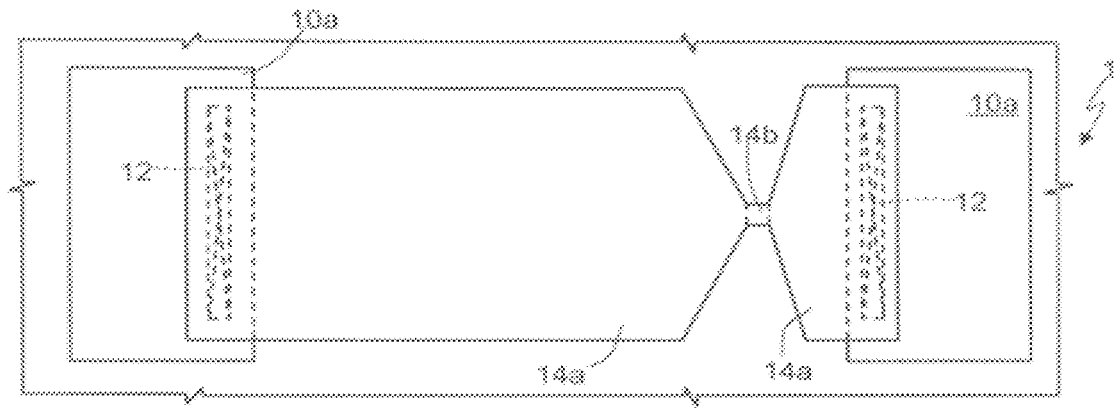

FIG. 9 shows a different embodiment of the resistor 1, in which trimming may be carried out electrically. To this end, the resistive region 14 has a second area of a reduced width, designated by 14b, intermediate between two first areas 14a. For the rest, the structure of the resistor 1 is similar to that of FIGS. 1 and 2; in particular, the cross-section is the same.

The second area 14b may also be in the semiconductive phase, while the first areas 14a may be in the metallic phase. In the example illustrated, the first areas 14a have portions with an increasing/decreasing width, so as to connect gradually to the second area 14b.

With this embodiment, the resistor 1 may be obtained as described above for the embodiment of FIGS. 1 and 2 and only the mask for defining the resistive region 14 changes.

In particular, in the example of $Ge_2Sb_2Te_5$ already considered previously, the resistive region 14 is formed in the metallic phase, and the second area 14b is converted into the semiconductive phase via an electrical pulse. Since the second area 14b has a reduced width as compared to the adjacent areas, a local crowding of the current paths is obtained, together with a confinement of the heat caused by the Joule effect, only in the area that is to undergo phase change.

To a first approximation, neglecting the thermal losses due to diffusion, the power P required for melting a volume V of phase change material is given by $$P = C_p V dT/dt$$

where $C_p$ is the thermal capacitance and dT/dt (derivative of the temperature as a function of time) may be approximated to $\Delta T/t_0$, where $\Delta T$ is the variation of temperature to which the material is subject to obtain melting thereof (~600° C.), and $t_0$ is the pulse duration.

Figure 10:
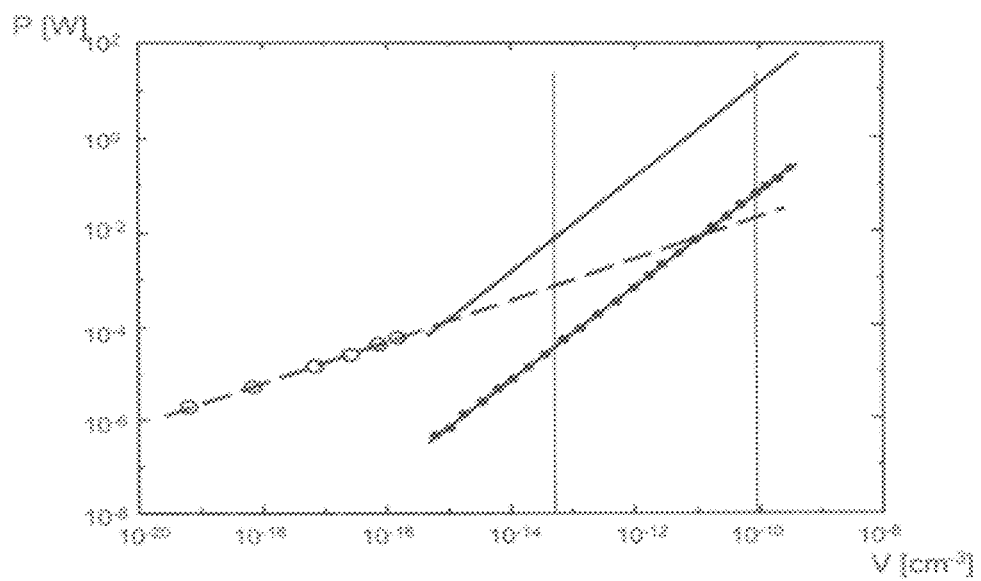
FIG. 10 shows an estimation of the power used for melting a region of an embodiment of a phase change resistor as a function of the volume.

FIG. 10 shows with a solid line the power necessary for melting an embodiment of a phase change material with composition $Ge_2Sb_2Te_5$, using a pulse of 5 ns. The power obtained, neglecting the diffusion, may be compared with the power calculated by S. Lai (S. Lai, Tyler Lowrey, "OUM—A 180 nm Nonvolatile Memory Cell Element Technology For Stand Alone and Embedded Applications", Session 36.5, IEDM Technical Digest (2001), which is incorporated by reference) considering a hemispherical phase change volume, as shown in FIG. 10 by circles; FIG. 10 also shows the extrapolated evolution, represented with a dashed line.

The comparison shows that, for low volumes (below $10^{-13}$ cm$^3$), as calculated by Lai, the effect of the diffusion heat leakage may be large, on account of the high surface-to-volume ratio.

Consequently, in this range, neglecting the diffusion, the necessary power is underestimated. However, for volumes corresponding to typical resistive regions to be trimmed (width and length in the range 1-100 μm, as is shown by the vertical dashed lines), the calculation without diffusion represents a worst case and may thus be used for evaluating the range of power necessary for trimming.

However, pulses of 5 ns are sufficiently long for melting the material but not for recrystallizing it, thus giving rise to amorphous regions. In order to obtain the polycrystalline semiconductive phase, longer pulses may be necessary. For this reason, FIG. 10 also shows, with a dotted line, the power obtained for pulses of a duration $t_0=1$ μs. Thus, it is possible to use a working window from 1 mW up to 10 W, which is sufficiently wide to ensure feasibility for different pulse durations and heated volumes.

The values of current and voltage necessary for trimming depend upon the desired value of resistance and upon the geometry of the resistor. The power required may be supplied by an external source or by a suitably provided source integrated in the substrate 2 (for example, a BJT).

Figure 11:
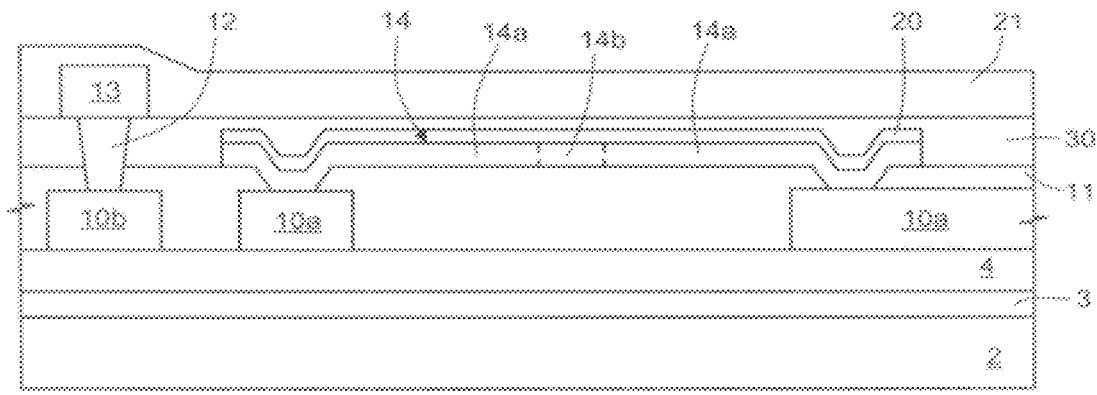
FIGS. 11-14 show cross-sections of different embodiments of the present resistor.

FIG. 11 shows a different embodiment, which differs from FIG. 1 because the resistive region 14 is connected directly to the respective bottom metal regions 10a. Here, after forming the intermediate dielectric layer 11, this is etched selectively so as to expose the bottom metal regions 10a. Then, the phase change material that is to form the resistive region 14 is deposited, in direct electrical contact with the bottom metal regions 10a. The protective layer 20 is defined together with the resistive region 14. After defining the resistive region 14 and the protective layer 20, a second dielectric layer 30 is deposited and, finally, the passivation layer 21. If the resistor 14 is not deposited after the last metal level, before deposition of the passivation layer 20, the vias are opened through the dielectrics 30 and 11 and are filled with appropriate conductive material to make a contact with the top metal level 13. Finally, the passivation layer 20 is deposited.

Figure 12:
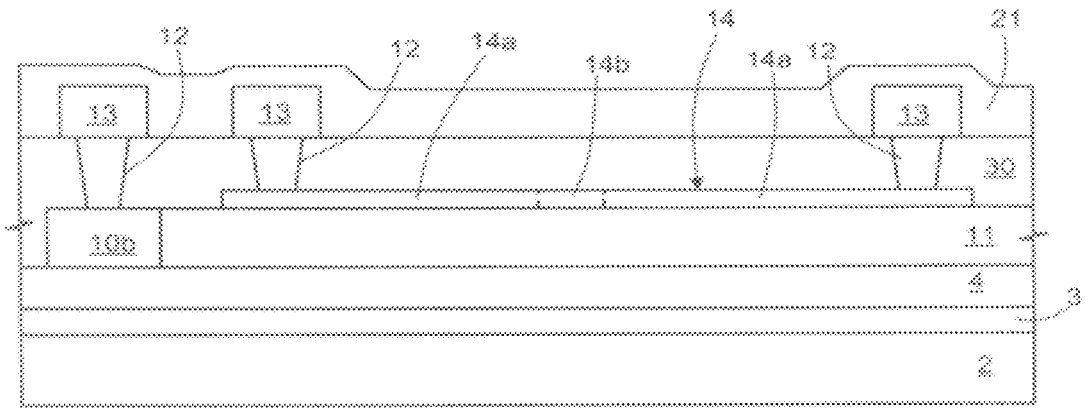

FIG. 12 shows another embodiment wherein the conductive region 14 is contacted through the top metal level. In detail, here the bottom metal regions 10a in direct contact with the resistor 14 are not formed. In addition, in the embodiment shown, the intermediate dielectric layer 11 has the same height as the bottom metal regions 10; alternatively, the layer 11 may be thicker, as in FIG. 1, and be traversed by the vias 12.

After forming the resistive region 14 and the second dielectric layer 30, the vias 12 are opened, some of which reach the ends of the resistive region 14. The vias 12 are filled as indicated previously, the top metal regions 13 and then the passivation layer 21 are formed.

Figure 13:
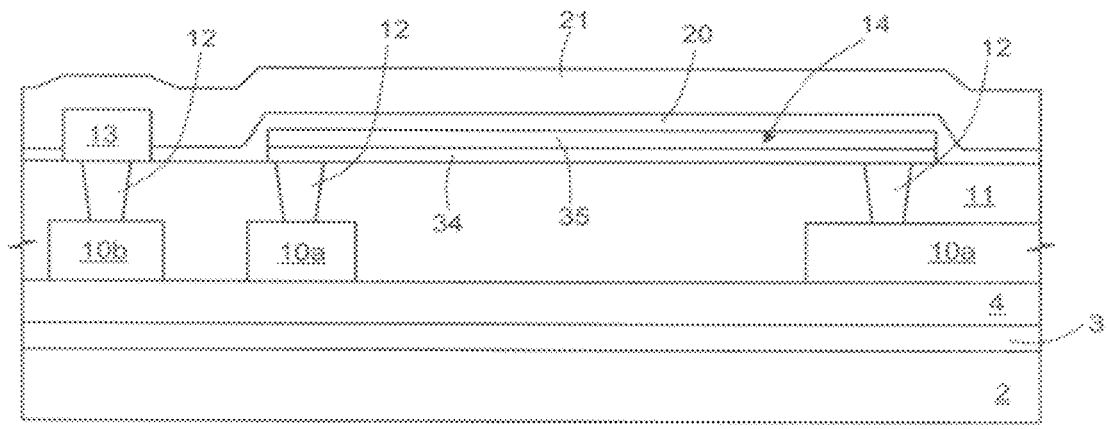

FIG. 13 shows an embodiment wherein the areas with different phase are arranged in parallel, instead of in series. In particular, in FIG. 13, the resistive region 14 is formed by a bottom layer 34, deposited on the intermediate dielectric layer 11, and by a top layer 35, deposited on the bottom layer 34. Since the metallic phase requires a deposition at a higher temperature as compared to the semiconductive phase, the bottom layer 34 is generally formed in the metallic phase, and the top layer 35 is formed in the semiconductive phase. By appropriately choosing the deposition parameters, in particular the deposition temperature and the thickness of the layers 34, 35, it is possible to form the resistive region 14 right from the start with the desired resistance value and with approximately zero temperature coefficient. In this case, the trimming has only the purpose of achieving a particularly precise value of resistance.

For example, if $R_5$ and $R_6$ are the resistance of the layers 34, 35 and $\rho_5$ and $\rho_6$ their resistivities, we have $$R = R_5 R_6/(R_5+R_6) = (\rho_5\rho_6)/(\rho_5 t_6 + \rho_6 t_5) \quad (5)$$

since the dimensions L and W are equal, with $t_5$ and $t_6$ being the thicknesses of the layers 34 and 35, respectively.

If the temperature coefficient is set to zero, i.e., dR/dT=0, we obtain $$\alpha_5 \rho_6^2 t_5 + \alpha_6 \rho_5^2 t_6 = 0 \quad (6)$$

Also in this case the system of equations (5), (6) admits of a single solution, and the ratio between the thicknesses in order to have a TCR close to zero is $$t_5/t_6 = -\alpha_6 \rho_5^2/(\alpha_5 \rho_6^2) \quad (7)$$

Very accurate resistance values may be obtained using the customary technique of laser-beam cutting.

Figure 14:
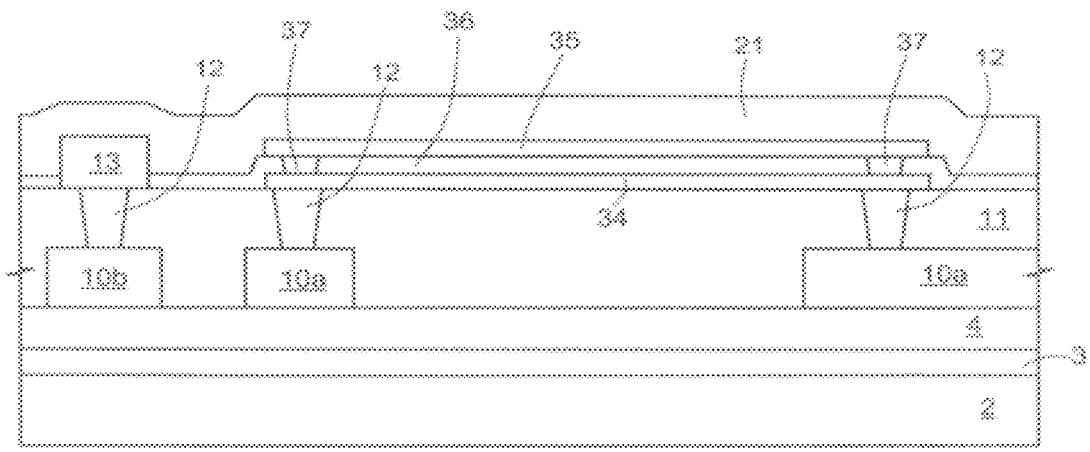

An alternative solution of parallel connection is shown in FIG. 14, where the top layer 35 is separated from the bottom layer 34 by a further dielectric layer 36, but the two layers 34, 35 are electrically connected through vias 37 or metal regions in contact with the ends of both of the layers 34, 35.

Figure 15:
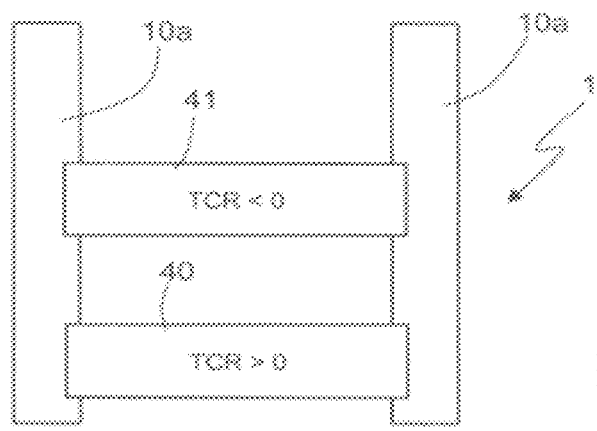
FIGS. 15-19 are top plan views of further embodiments of phase change resistors.

FIG. 15 shows a different, parallel connection solution, wherein the resistor 1 comprises a first branch 40 and a second branch 41, formed on a same plane and connected at the ends by two metal connections, designated once again by 10a. One of the two branches (in the example, the first branch 40) is in the metallic phase and has TCR>0, and the other branch (here the second branch 41) is in the semiconductive phase and has TCR<0. The cross-section in this embodiment is the same of the solution that uses a single resistive region 14, and thus may be any of FIGS. 1, 11 and 12.

In this case, the manufacture of the resistor 1 may comprise, after the formation of the intermediate dielectric layer 11 (if envisaged), the deposition of a first layer of phase change material at a temperature such as to obtain the metallic phase. Then, the first branch 40 is defined.

Next, a second layer of phase change material is deposited at a second temperature, lower than the first temperature so as to obtain a semiconductive phase. Then, the second layer of phase change material is defined so as to form the second branch 41.

Also in this case, by choosing appropriate geometrical and process parameters (width, thickness, and possibly length), it is possible to obtain the desired overall resistance value and a practically zero temperature coefficient.

If, however, it is desired to have a very precise value of resistance, it is possible to intervene by conventional laser cutting.

Alternatively, it is possible to use a mixed, parallel/series, structure wherein the first branch 40, in the metallic phase, is subject to electrical or laser trimming.

Figure 16:
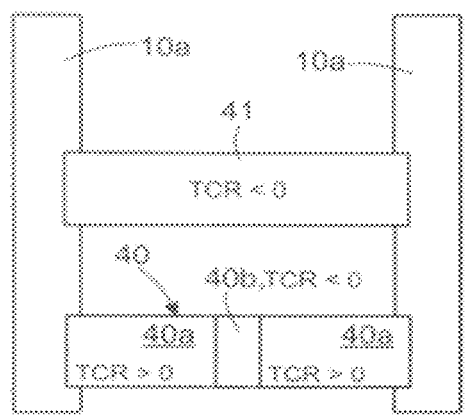

For example, FIG. 16 shows a mixed solution, wherein the first branch 40 has been subject to laser trimming and, after EWS, it is formed by two side areas 40a, still in the metallic phase, and by an intermediate area 40b, in the semiconductive phase. Also in this case, the number and dimensions of the areas 40a, 40b of the first branch 40 may vary, provided that the resistor 1 has a predetermined overall resistance and an approximately zero temperature coefficient.

Figure 17:
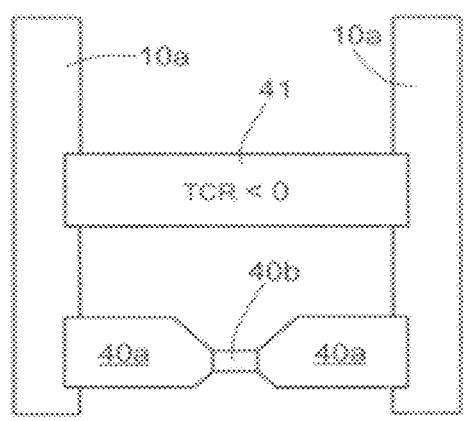

FIG. 17 shows a mixed solution, wherein the first branch 40 is structured so as that it may be subject to electrical trimming. To this end, the first branch 40 comprises, between the two side areas 40a, in the metallic phase, an area of reduced width, designated once again, for reasons of simplicity, as 40b, in the semiconductive phase.

Figure 18:
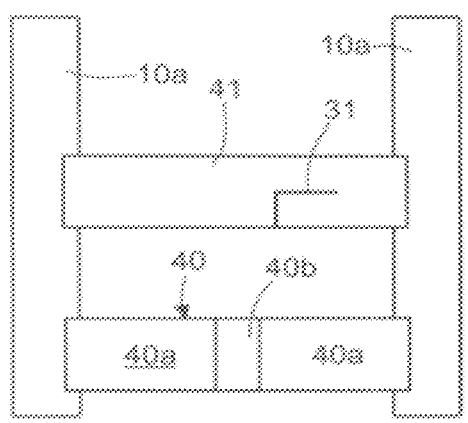

Moreover, in FIG. 18, the structure of FIG. 16 has been undergone laser cutting so as to adjust the total resistance R precisely. To this end, the second branch 41, in the semiconductive phase, has a cut 31.

Figure 19:
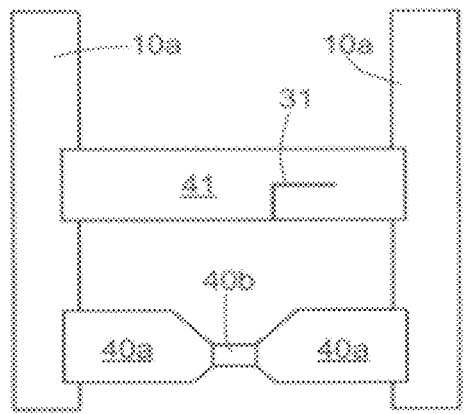

FIG. 19 shows a mixed structure in which the first branch 40 is subject to electrical trimming, and the second branch 41, in the semiconductive phase, has undergone laser cutting.

Figure 20:
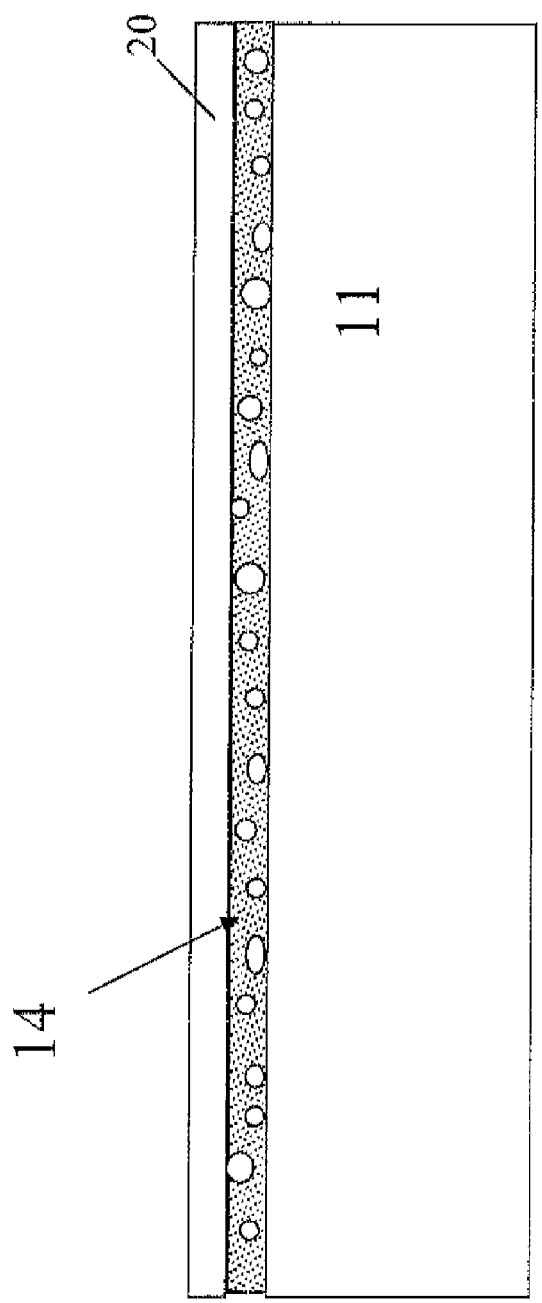
FIG. 20 is a view in cross-section of an embodiment of a phase change resistor

Referring to FIG. 20, another embodiment is a mixed, parallel/series structure where the phase change resistor includes a mixture of the two different polycrystalline phases, metallic and semiconductive, so as to have an intermediate phase with resistivity p and approximately zero TCR. Such a phase change resistor may be manufactured following any of the structures shown in FIGS. 1, 11 and 12, with layout as shown in FIG. 2 or 9. Such a resistor may be trimmed by thermal annealing, laser annealing, electric pulses, or laser cutting, in order to achieve higher precision.

The intermediate phase shown in FIG. 20 may be obtained during the deposition step or subsequently through one or more dedicated thermal annealing steps at one or more temperatures in the range of approximately 100-450° C.

Figure 21:
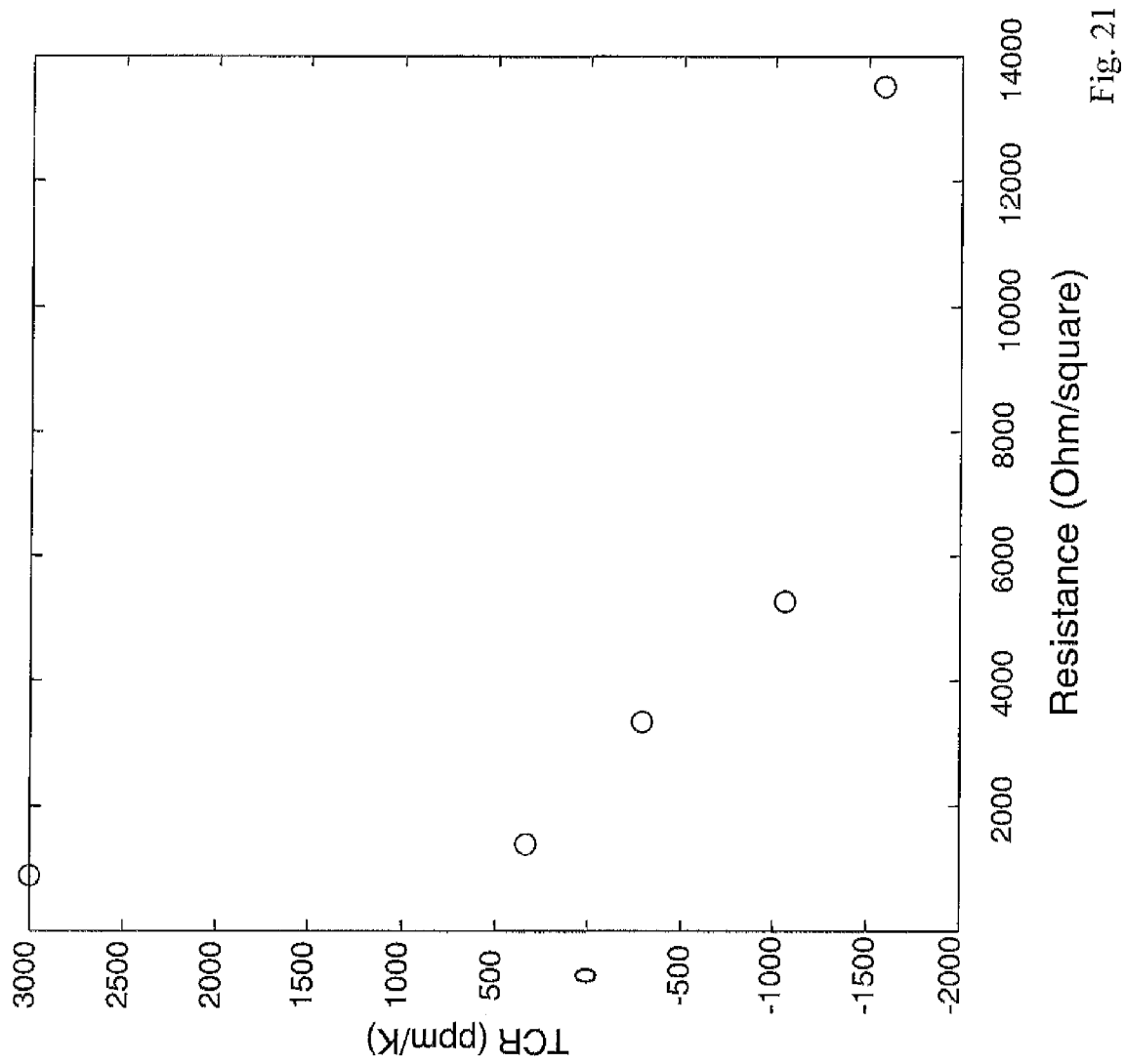
FIG. 21 shows the TCR as a function of resistance for an embodiment of a phase change resistor

FIG. 21 shows the TCR as a function of resistance, as measured for a resistor made from $Ge_2Sb_2Te_5$ in an embodiment according to FIG. 20. Various resistances values have been obtained by varying the annealing temperature in the range of approximately 150-400° C.

An embodiment of the integrated resistor described herein has numerous advantages.

In particular, it enables trimming of the temperature coefficient and/or of the resistance in a simple way; its fabrication does not entail particular difficulties and does not require appropriate machinery so that the manufacturing costs are limited.

In addition, since trimming of the temperature coefficient occurs by melting and subsequent cooling of the material, via laser or by the Joule effect, it is a reversible operation so that it is possible to correct trimming or perform a subsequent trimming to increase or decrease the resistivity of the trimmed area.

The method of manufacturing the integrated resistor may employ any technology, since it requires, in its simplest solution, a single deposition and one masking step; however, also in the case of double deposition and double masking, the costs are contained.

In addition, using the phase transitions for trimming the resistance and the temperature coefficient, no material is blown up, thus eliminating problems of leakage and reducing the stress.

In the case of electrical trimming, the manufacturing process is particularly simple and inexpensive since it does not require the laser apparatus. In addition, the trimming may occur also after packaging using an internal or external current source.

Finally, thanks to the reduced thermal budget and to the possibility of depositing the phase change material layer at room temperature in the amorphous phase and of converting it subsequently into one of the possible polycrystalline phases via laser pulses, an embodiment of the present resistor may also be easily used in new electronic applications, for example, on plastic or flexible substrates. The compatibility of the phase change materials with polycarbonate substrates has been, on the other hand, amply demonstrated by the widespread use of phase change materials as substrate for storing information in CDROMs and re-writable DVDs.

Finally, it is clear that modifications and variations may be made to the embodiments described and illustrated herein without thereby departing from the scope of the present disclosure.

For example, in the series embodiment, it is possible to provide the two areas 14a, 14b via different phase change regions, defined starting from a same deposited layer or from two different layers, electrically connected by metal lines.

In addition, in the parallel and mixed structure, it is possible to provide more than two branches in series or in parallel. It is moreover possible for the branch having a number of crystalline phases to be prevalently in the metallic phase or vice versa, according to the composition, and thus the electrical properties, of the material used.

In addition, the number of resistors that it is possible to connect in series and/or in parallel may vary, as likewise the possible trimming combinations. The cut 31 may also be performed on the branch 40 in the metallic phase, or on both of the branches; it also may be performed on more than two resistors, however connected, in whatever phase they may be.

Finally, the laser trimming, as likewise the electrical trimming, may also be envisaged in the semiconductor branch, by remelting it and cooling it to a temperature such as to obtain the metallic phase.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A resistor structure of phase change material, comprising a resistor formed by at least one first and one second portions electrically coupled to each other and in different crystalline phases, wherein said first portion has a positive temperature coefficient and said second portion has a negative temperature coefficient and the first and the second portions have such resistivities and are coupled so that the resistor has an approximately zero overall temperature coefficient.

2. A resistor structure according to claim 1 wherein said phase change material has two crystalline phases.

3. A resistor structure according to claim 2 wherein one of the two said crystalline phases has a positive temperature coefficient of resistance and the other has a negative temperature coefficient of resistance.

4. A resistor structure according to claim 1, wherein the first and the second portions are arranged in series to each other, the first portion having a temperature coefficient $\alpha_1$ and a geometric factor $N_1$ and the second portion having an temperature coefficient $\alpha_2$ opposite to $\alpha_1$, and a geometric factor $N_2$, wherein:

$$\alpha_1 N_1 + \alpha_2 N_2 = 0.$$

5. A resistor structure according to claim 4, comprising a single monolithic strip of a phase change material, accommodating both the first and the second portions, said strip having uniform width and length.

6. A resistor structure according to claim 4, wherein said first portion has a larger width than said second portion.

7. A resistor structure according to claim 1, wherein said first portion comprises at least two lateral areas and said second portion comprises at least an intermediate area arranged between said two lateral areas.

8. A resistor structure according to claim 1, comprising a first and a second strips of phase change material accommodating the first and the second portion respectively, said first and second strip being mutually connected in parallel.

9. A resistor structure according to claim 8, wherein said first and second strips are mutually overlaid.

10. A resistor structure according to claim 6, wherein said first and second strip are arranged side-by-side.

11. A resistor structure of phase change material, comprising
a resistor formed by at least one first and one second portions electrically coupled to each other and in different crystalline phases, wherein said first portion has a positive temperature coefficient and said second portion has a negative temperature coefficient and the first and the second portions have such resistivities and are coupled so that the resistor has an approximately zero overall temperature coefficient; and
a first and a second strips of phase change material accommodating the first and the second portion respectively, said first and second strip being mutually connected in parallel;
wherein at least one strip between said first and second strip comprises an area having an opposite temperature coefficient.

12. A resistor structure according to claim 1, wherein at least one portion between said first and second portions has a laser cut.

13. An article, comprising:
a first element of a material that is in a first state, the first element having a first resistive temperature coefficient of a first polarity; and
a second element of the material that is in a second state, the second element electrically coupled to the first element and having a second resistive temperature coefficient of a second polarity that is opposite to the first polarity.

14. The article of claim 13 wherein the material comprises a compound that includes germanium, antimony, and tellurium.

15. The article of claim 13 wherein:
one of the first and second states comprises a metallic phase; and
the other of the first and second states comprises a semiconductive phase.

16. The article of claim 13 wherein:
one of the first and second states comprises a first polycrystalline phase; and
the other of the first and second states comprises a second polycrystalline phase.

17. The article of claim 13 wherein:
the first state comprises a metallic phase;
the second state comprises a semiconductive phase;
the first polarity comprises a positive polarity; and
the second polarity comprises a negative polarity.

18. The article of claim 13 wherein the first element is integral with the second element.

19. The article of claim 13 wherein the first element has at least one dimension that has a different size than a corresponding dimension of the second element.

20. The article of claim 13 wherein the first element is in electrical series with the second element.

21. The article of claim 13 wherein the first element is in electrical parallel with the second element.

22. The article of claim 13 wherein one of the first and second elements includes a cut.

23. The article of claim 13 wherein the first element contacts the second element.

24. The article of claim 13, further comprising a third element of the material in one of the first and second states, the third element electrically coupled to at least one of the first and second elements.

25. The article of claim 13 wherein the overall temperature coefficient of resistance is approximately zero.

26. An integrated circuit, comprising:
a first element of a material that is in a first state, the first element having a first resistive temperature coefficient of a first polarity; and
a second element of the material that is in a second state, the second element electrically coupled to the first element and having a second resistive temperature coefficient of a second polarity that is opposite to the first polarity.

27. The integrated circuit of claim 26, further comprising:
a level; and
wherein the first and second elements are disposed at the level.

28. The integrated circuit of claim 26, further comprising:
first and second levels; and wherein the first and second elements are respectively disposed at the first and second levels.

29. The integrated circuit of claim 26, further comprising:
a layer; and
wherein the first and second elements are disposed in the layer.

30. The integrated circuit of claim 26, further comprising:
first and second layers; and
wherein the first and second elements are respectively disposed in the first and second layers.

31. The integrated circuit of claim 26 wherein:
one of the first and second states comprises a first polycrystalline phase; and
the other of the first and second states comprises a second polycrystalline phase.

32. The integrated circuit of claim 26 wherein the overall temperature coefficient of resistance is approximately zero.

33. A system, comprising:
resistor, comprising:
a first element of a material that is in a first state, the first element having a first resistive temperature coefficient of a first polarity; and
a second element of the material that is in a second state, the second element electrically coupled to the first element and having a second resistive temperature coefficient of a second polarity that is opposite to the first polarity; and
at least one circuit element coupled to the resistor.

34. The system of claim 33 wherein the resistor and the at least one circuit element are disposed on a same die.

35. The system of claim 33 wherein the resistor and the at least one circuit element are disposed on respective dies.

36. The system of claim 33 wherein the overall temperature coefficient of resistance is approximately zero.

37. An article, comprising:
a first portion of a material that is in a first state, the first portion having a first resistive temperature coefficient of a first polarity;
a second portion of the material that is in a second state, the second portion having a second resistive temperature coefficient of a second polarity that is opposite to the first polarity, the second portion forming with the first portion a mixture of the material, the mixture having a third resistive temperature coefficient of a magnitude that is below a threshold.

38. The article of claim 37 wherein the third temperature coefficient is approximately zero.

39. The article of claim 37 wherein:
the first state comprises a first crystalline phase of the material;
the second state comprises a second crystalline phase of the material; and
the mixture comprises grains of one of the first and second crystalline phases embedded in the other of the first and second crystalline phases.

* * * * *